United States Patent
Kawabata

(10) Patent No.: US 9,818,518 B2
(45) Date of Patent: Nov. 14, 2017

(54) COMPOSITE MAGNETIC SEALING MATERIAL

(71) Applicant: TDK Corporation, Tokyo (JP)

(72) Inventor: Kenichi Kawabata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/351,701

(22) Filed: Nov. 15, 2016

(65) Prior Publication Data
US 2017/0287604 A1    Oct. 5, 2017

Related U.S. Application Data

(60) Provisional application No. 62/315,860, filed on Mar. 31, 2016.

(30) Foreign Application Priority Data

Oct. 27, 2016 (JP) .................. 2016-210146

(51) Int. Cl.
| | | |
|---|---|---|
| *H01F 1/20* | (2006.01) | |
| *H01F 1/147* | (2006.01) | |
| *H05K 9/00* | (2006.01) | |
| *H01L 23/10* | (2006.01) | |
| *H01L 23/18* | (2006.01) | |

(52) U.S. Cl.
CPC ......... *H01F 1/14733* (2013.01); *H01L 23/10* (2013.01); *H01L 23/18* (2013.01)

(58) Field of Classification Search
CPC ... H01F 1/14741; H01F 1/1475; H01L 23/18; H01L 23/10
See application file for complete search history.

(56) References Cited

FOREIGN PATENT DOCUMENTS

| | | |
|---|---|---|
| JP | H01-283900 A | 11/1989 |
| JP | H02-078299 A | 3/1990 |
| JP | H10-064714 A | 3/1998 |
| JP | H11214592 | 6/1999 |

*Primary Examiner* — Carol M Koslow
(74) *Attorney, Agent, or Firm* — Young Law Firm, P.C.

(57) ABSTRACT

Disclosed herein is a composite magnetic sealing material includes a resin material and a filler blended in the resin material in a blended ratio of 30 vol. % or more to 85 vol. % or less. The filler includes a magnetic filler containing Fe and 32 wt. % or more and 39 wt. % or less of a metal material contained mainly of Ni, thereby a thermal expansion coefficient of the composite magnetic sealing material is 15 ppm/° C. or less.

14 Claims, 18 Drawing Sheets

COMPOSITION 1

| | | |
|---|---:|---|
| Fe | 54.81 | wt% |
| Ni | 45.00 | wt% |
| Co | 0.00 | wt% |
| Mn | 0.12 | wt% |
| Cr | 0.068 | wt% |
| D10 | 7.25 | µm |
| D50 | 19.86 | µm |
| D90 | 31.77 | µm |

COMPOSITION 2

| | | |
|---|---:|---|
| Fe | 64.38 | wt% |
| Ni | 35.50 | wt% |
| Co | 0.00 | wt% |
| Mn | 0.10 | wt% |
| Cr | 0.019 | wt% |
| D10 | 7.10 | µm |
| D50 | 20.01 | µm |
| D90 | 32.42 | µm |

COMPOSITION 3

| | | |
|---|---:|---|
| Fe | 63.08 | wt% |
| Ni | 32.00 | wt% |
| Co | 4.76 | wt% |
| Mn | 0.14 | wt% |
| Cr | 0.019 | wt% |
| D10 | 6.60 | µm |
| D50 | 18.95 | µm |
| D90 | 31.05 | µm |

FIG. 17

THERMAL EXPANSION COEFFICIENT [ppm/°C]

| FILLER | FILLER CONTENT (vol.%) | | |
|---|---|---|---|
| | 50 | 60 | 70 |
| $SiO_2$ | 29.7 | 17.1 | 8.2 |
| COMPOSITION 1 | 60.0 | 25.4 | 15.1 |
| COMPOSITION 2 | 44.7 | 19.8 | 9.9 |
| COMPOSITION 3 | 41.5 | 17.8 | 8.8 |

FIG. 18

PERMEABILITY

| FILLER | FILLER CONTENT (vol.%) | | |
|---|---|---|---|
| | 50 | 60 | 70 |
| COMPOSITION 1 | 8.3 | 10.6 | 12.6 |
| COMPOSITION 2 | 8.4 | 11.1 | 12.5 |
| COMPOSITION 3 | 8.2 | 11.0 | 12.1 |

FIG. 19

COMPOSITE MAGNETIC SEALING MATERIAL

BACKGROUND OF THE INVENTION

Field of the Invention

The present invention relates to a composite magnetic sealing material and, more particularly, to a composite magnetic sealing material suitably used as a molding material for electronic circuit package.

Description of Related Art

In recent years, an electronic device such as a smartphone is equipped with a high-performance radio communication circuit and a high-performance digital chip, and an operating frequency of a semiconductor IC used therein tends to increase. Further, adoption of an SIP (System-In Package) having a 2.5D or 3D structure, in which a plurality of semiconductor ICs are connected by a shortest wiring, is accelerated, and modularization of a power supply system is expected to accelerate. Further, an electronic circuit module having a large number of modulated electronic components (collective term of components, such as passive components (an inductor, a capacitor, a resistor, a filter, etc.), active components (a transistor, a diode, etc.), integrated circuit components (an semiconductor IC, etc.) and other components required for electronic circuit configuration) is expected to become more and more popular, and an electronic circuit package which is a collective term for the above SIP, electronic circuit module, and the like tends to be mounted in high density along with sophistication, miniaturization, and thinning of an electronic device such as a smartphone. However, this tendency poses a problem of malfunction and radio disturbance due to noise. The problem of malfunction and radio disturbance is difficult to be solved by conventional noise countermeasure techniques. Thus, recently, self-shielding of the electronic circuit package has become accelerated, and an electromagnetic shielding using a conductive paste or a plating or sputtering method has been proposed and put into practical use, and higher shielding characteristics are required in the future.

To achieve this, recently, there are proposed electronic circuit packages in which a molding material itself has magnetic shielding characteristics. For example, Japanese Patent Application Laid-Open No. H10-64714 discloses a composite magnetic sealing material added with soft magnetic powder having an oxide film as a molding material for electronic circuit package.

However, conventional composite magnetic sealing materials have a drawback in that it has a large thermal expansion coefficient. Thus, a mismatch occurs between a composite magnetic sealing material and a package substrate or electronic components in terms of the thermal expansion coefficient. As a result, an aggregated substrate having a strip shape after molding may be greatly warped, or there may occur a warp large enough to cause a problem with connectivity of an electronic circuit package in a diced state in mounting reflow. This phenomenon will be described in detail below.

In recent years, various structures have been proposed for and actually put into practical use as a semiconductor package or an electronic component module, and, currently, there is generally adopted a structure in which electronic components such as semiconductor ICs are mounted on an organic multilayer substrate, followed by molding of the upper portion and periphery of the electronic component package by a resin sealing material. A semiconductor package or electronic component module having such a structure is molded as an aggregated substrate, followed by dicing.

In this structure, an organic multilayer substrate and a resin sealing material having different physical properties constitute a so-called bimetal, so that a warp may occur due to the difference between thermal expansion coefficients, glass transition, or curing shrinkage of a molding material. To suppress the warp, it is necessary to make the physical properties such as thermal expansion coefficients coincide with each other as much as possible. In recent years, an organic multilayer substrate used for a semiconductor package or an electronic circuit module is getting thinner and thinner and is increasing in the number of layers thereof to meet requirements for height reduction. In order to realize high rigidity and low thermal expansion for ensuring good handleability of a thin substrate while achieving the thickness reduction and multilayer structure, use of a substrate material having a high glass transition temperature, addition of a filler having a small thermal expansion coefficient to a substrate material, or use of glass cloth having a smaller thermal expansion coefficient is a common practice at present.

On the other hand, the difference in physical properties between semiconductor ICs and electronic components mounted on a substrate and a molding material also generates a stress, causing various problems such as interfacial delamination of the molding material and crack of the electronic components or molding material. Incidentally, silicon is used as the semiconductor ICs. The thermal expansion coefficient of silicon is 3.5 ppm/° C., and that of a baked chip component such as a ceramic capacitor or an inductor is about 10 ppm/° C.

Thus, the molding material is also required to have a small thermal expansion coefficient, and some commercially-available materials have a thermal expansion coefficient below 10 ppm/° C. As a method for reducing the thermal expansion coefficient of the molding material, adopting an epoxy resin having a small thermal expansion coefficient, as well as, blending fused silica having a very small thermal expansion coefficient of 0.5 ppm/° C. in a sealing resin at a high filling rate can be taken.

General magnetic materials have a high thermal expansion coefficient. Thus, as described in Japanese Patent Application Laid-Open No. H10-64714, the composite magnetic sealing material obtained by adding general soft magnetic powder to a mold resin cannot achieve a target small thermal expansion coefficient.

SUMMARY

An object of the present invention is therefore to provide a composite magnetic sealing material having a small thermal expansion coefficient.

A composite magnetic sealing material according to the present invention includes a resin material and a filler blended in the resin material in a blended ratio of 30 vol. % or more to 85 vol. % or less. The filler includes a magnetic filler containing Fe and 32 wt. % or more and 39 wt. % or less of a metal material contained mainly of Ni, thereby a thermal expansion coefficient of the composite magnetic sealing material is 15 ppm/° C. or less.

According to the present invention, the thermal expansion coefficient of the composite magnetic sealing material can be reduced to 15 ppm/° C. or less by using the magnetic filler having a small thermal expansion coefficient. Thus, when the composite magnetic sealing material according to the present invention is used as a molding material for an electronic circuit package, it is possible to prevent the warp of the substrate, interfacial delamination or crack of a molding material.

In the present invention, the metal material may further contain 0.1 wt. % or more and 8 wt. % or less of Co relative to the total weight of the magnetic filler. This enables a further reduction in the thermal expansion coefficient of the composite magnetic sealing material.

In the present invention, the filler may further include a non-magnetic filler. This enables a further reduction in the thermal expansion coefficient of the composite magnetic sealing material. In this case, the ratio of the amount of the non-magnetic filler relative to the sum of the amounts of the magnetic filler and the non-magnetic filler is preferably 1 vol. % or more and 40 vol. % or less. This enables a further reduction in the thermal expansion coefficient of the composite magnetic sealing material while ensuring sufficient magnetic characteristics. In this case, the non-magnetic filler preferably contains at least one material selected from the group consisting of $SiO_2$, $ZrW_2O_8$, $(ZrO)_2P_2O_7$, $KZr_2(PO_4)_3$, or $Zr_2(WO_4)(PO_4)_2$. These materials have a very small or negative thermal expansion coefficient, thus enabling a further reduction in the thermal expansion coefficient of the composite magnetic sealing material.

In the present invention, the magnetic filler preferably has a substantially spherical shape. This enables an increase in the ratio of the magnetic filler to the composite magnetic sealing material.

In the present invention, the surface of the magnetic filler is preferably insulatively coated, and the film thickness of the insulating coating is preferably 10 nm or more. With this configuration, the volume resistivity of the composite magnetic sealing material can be increased to, e.g., $10^{10}$ Ωcm or more, making it possible to ensure insulating performance required for a molding material for an electronic circuit package.

In the present invention, the resin material is preferably a thermosetting resin material, and the thermosetting resin material preferably contains at least one material selected from the group consisting of an epoxy resin, a phenol resin, a urethane resin, a silicone resin, or an imide resin.

As described above, the composite magnetic sealing material according to the present invention has a small thermal expansion coefficient. Thus, when the composite magnetic sealing material is used as a sealing material for an electronic circuit package, it is possible to prevent the warp of the substrate, interfacial delamination or crack of a molding material.

BRIEF DESCRIPTION OF THE DRAWINGS

The above features and advantages of the present invention will be more apparent from the following description of certain preferred embodiments taken in conjunction with the accompanying drawings, in which:

FIG. 17 is a table indicating compositions 1 to 3; and

FIGS. 18 and 19 are tables indicating measurement results of the Examples.

DETAILED DESCRIPTION OF THE EMBODIMENTS

Preferred embodiments of the present invention will be explained below in detail with reference to the accompanying drawings.

Figure 1:
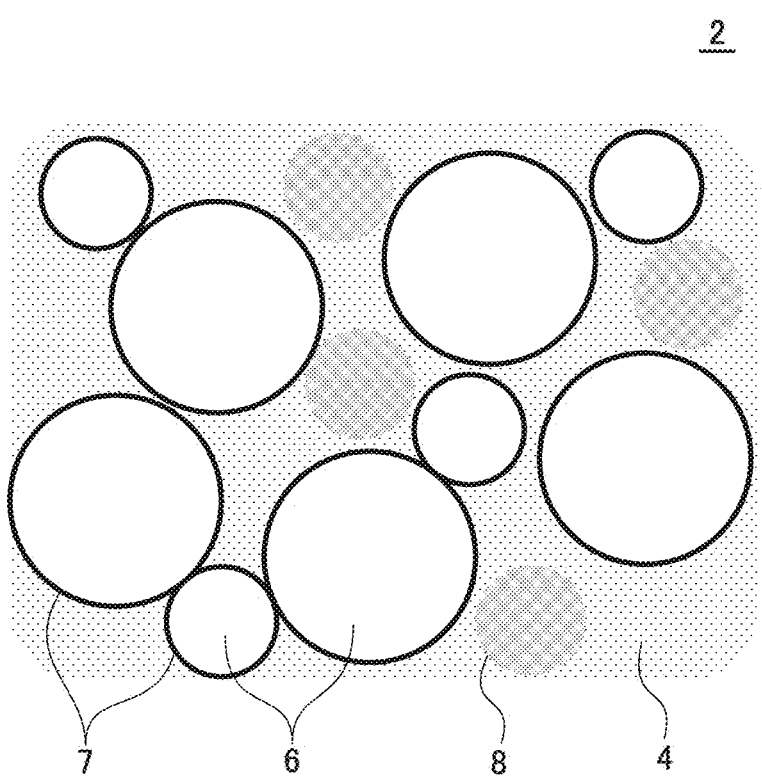
FIG. 1 is a schematic view for explaining a configuration of a composite magnetic sealing material according to a preferred embodiment of the present invention.

FIG. 1 is a schematic view for explaining a configuration of a composite magnetic sealing material according to a preferred embodiment of the present invention.

As illustrated in FIG. 1, a composite magnetic sealing material 2 according to the present embodiment includes a resin material 4, and a magnetic filler 6 and a non-magnetic filler 8 which are blended in the resin material 4. Although not especially limited, the resin material 4 is preferably composed mainly of a thermosetting resin material. Specifically, the resin material 4 is preferably composed mainly of an epoxy resin, a phenol resin, a urethane resin, a silicone resin, or an imide resin and more preferably uses a base resin and a curing agent used for an epoxy resin-based or a phenol resin-based semiconductor sealing material.

The most preferable is the epoxy resin having a reactive epoxy group at its terminal, which can be combined with various types of curing agents and curing accelerators. Examples of the epoxy resin include a bisphenol A epoxy resin, a bisphenol F epoxy resin, a phenoxy type epoxy resin, a naphthalene type epoxy resin, a multifunctional-type epoxy resin (dicyclopentadiene type epoxy resin, etc.), a biphenyl-type (bifunctional) epoxy resin, and an epoxy resin having a special structure. Among them, the biphenyl type epoxy resin, naphthalene type epoxy resin, and dicyclopentadiene type epoxy resin are useful since they can attain low thermal expansion. Examples of the curing agent or curing accelerator include amine-based compound alicyclic diamine, aromatic diamine, other amine-based compounds (imidazole, tertiary amine, etc.), an acid anhydride compound (high-temperature curing agent, etc.), a phenol resin (novolac type phenol resin, cresol novolac type phenol resin, etc.), an amino resin, dicyandiamide, and a Lewis acid complex compound. For material kneading, known means such as a kneader, three-roll mills, or a mixer may be used.

The magnetic filler 6 is formed of an Fe—Ni based material and contains 32 wt. % or more and 39 wt. % or less of a metal material composed mainly of Ni. The remaining 61-68 wt. % is Fe. The blending ratio of the magnetic filler 6 to the composite magnetic sealing material 2 is 30 vol. % or more and 85 vol. % or less. When the blending ratio of the magnetic filler 6 is less than 30 vol. %, it is difficult to obtain sufficient magnetic characteristics; on the other hand, when the blending ratio of the magnetic filler 6 exceeds 85 vol. %, it is difficult to ensure characteristics, such as flowability, required for a sealing material.

The metal material composed mainly of Ni may contain a small amount of Co. That is, a part of Ni may be substituted by Co. The containment of Co enables a further reduction in the thermal expansion coefficient of the composite magnetic sealing material 2. The adding amount of Co to the composite magnetic sealing material 2 is preferably 0.1 wt. % or more and 8 wt. % or less.

The shape of the magnetic filler 6 is not especially limited. However, the magnetic filler 6 may preferably be formed into a spherical shape for high packing density. Further, fillers of different particle sizes may be blended as the magnetic filler 6 for closest packing. Further, forming the magnetic filler 6 into a spherical shape (or substantially a spherical shape) enables a reduction in damage to electronic components during molding. Particularly, for high packing density or closest packing, the shape of the magnetic filler 6 is preferably a true sphere. The magnetic filler 6 preferably has a high tap density and a small specific surface area. As a formation method for the magnetic filler 6, there are known a water atomization method, a gas atomization method, and a centrifugal disc atomization method. Among them, the gas atomization method is most preferable since it can achieve a high tap density and reduce the specific surface area.

Although not especially limited, the surface of the magnetic filler 6 is covered with an insulating coat 7 formed of an oxide of metal such as Si, Al, Ti, or Mg or an organic material for enhancement of flowability, adhesion, and insulation performance. To sufficiently enhance the volume resistivity of the composite magnetic sealing material 2, the film thickness of the insulating coat 7 is preferably set to 10 nm or more. The insulating coat 7 may be achieved by coating a thermosetting material on the surface of the magnetic filler 6 or may be achieved by formation of an oxide film by hydration of metal alkoxide such as tetraethyloxysilane or tetraemthyloxysilane and, most preferably, it is achieved by formation of a silicon oxide coating film. Further, more preferably, organofunctional coupling treatment is applied to the insulating coat 7.

The composite magnetic sealing material 2 according to the present embodiment contains the non-magnetic filler 8. As the non-magnetic filler 8, a material having a smaller thermal expansion coefficient than that of the magnetic filler 6, such as $SiO_2$, $ZrW_2O_8$, $(ZrO)_2P_2O_7$, $KZr_2(PO_4)_3$, or $Zr_2(WO_4)(PO_4)_2$, or a material having a negative thermal expansion coefficient is preferably used. By adding the non-magnetic filler 8 to the composite magnetic sealing material 2, it is possible to further reduce the thermal expansion coefficient. Further, the following materials may be added to the composite magnetic sealing material 2: flame retardant such as aluminum oxide or magnesium oxide; carbon black, pigment, or dye for coloring; surface-treated nanosilica having a particle diameter of 100 nm or less for enhancement of slidability, flowability, and dispersibility/kneadability; and a wax component for enhancement of mold releasability. It is not essential that the composite magnetic sealing material according to the present invention contains the non-magnetic filler.

Further, organofunctional coupling treatment may be applied to the surface of the magnetic filler 6 or surface of the non-magnetic filler 8 for enhancement of adhesion and flowability. The organofunctional coupling treatment may be performed using a known wet or dry method, or by an integral blend method. Further, the surface of the magnetic filler 6 or surface of the non-magnetic filler 8 may be coated with a thermosetting resin for enhancement of wettability.

When the non-magnetic filler 8 is added, the ratio of the amount of the non-magnetic filler 8 relative to the sum of the amounts of the magnetic filler 6 and the non-magnetic filler 8 is preferably 1 vol. % or more and 40 vol. % or less. In other words, 1 vol. % or more and 40 vol. % or less of the magnetic filler 6 can be substituted by the non-magnetic filler 8. When the additive amount of the non-magnetic filler 8 is less than 1 vol. %, addition effect of the non-magnetic filler 8 is hardly obtained; on the other hand, when the additive amount of the non-magnetic filler 8 exceeds 40 vol. %, the relative amount of the magnetic filler 6 is too small, resulting in difficulty in providing sufficient magnetic characteristics.

The composite magnetic sealing material 2 may be a liquid or solid, depending on selection of a base resin and a curing agent according to the molding method therefor. The composite magnetic sealing material 2 in a solid state may be formed into a tablet shape for transfer molding and into a granular shape for injection molding or compression molding. The molding method using the composite magnetic sealing material 2 may be appropriately selected from among the followings: transfer molding; compression molding; injection molding; cast molding; vacuum cast molding; vacuum printing; printing; dispensing; and a method using a slit nozzle. A molding condition may be appropriately selected from combinations of the base resin, curing agent and curing accelerator to be used. Further, after-cure treatment may be applied as needed after the molding.

Figure 2:
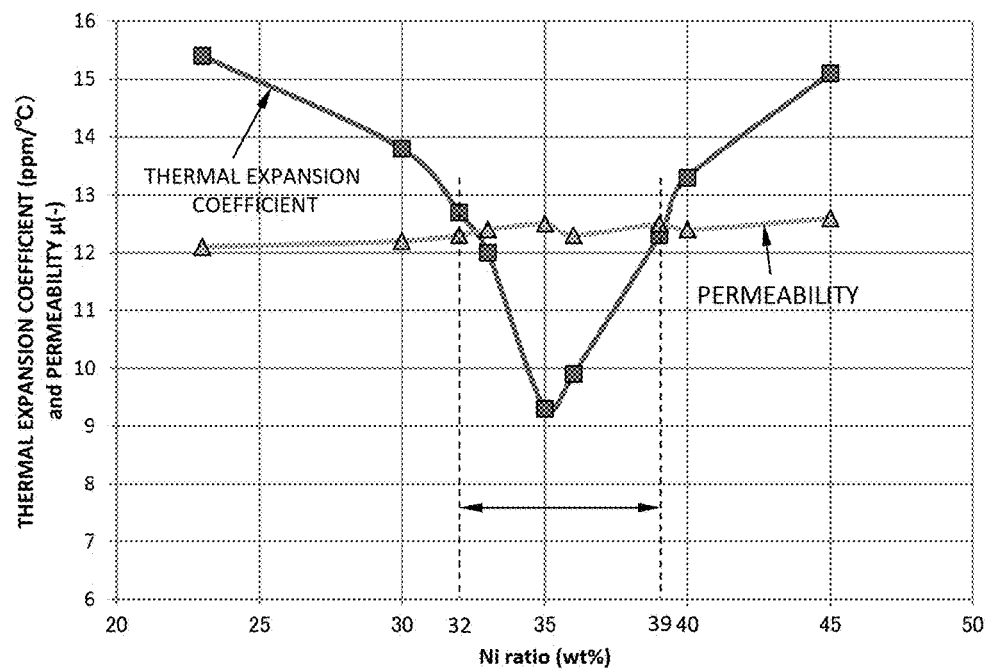
FIG. 2 is a graph illustrating the relationship between the Ni ratio of the magnetic filler and the thermal expansion coefficient and the magnetic permeability of the composite magnetic sealing material.

FIG. 2 is a graph illustrating the relationship between the Ni ratio of the magnetic filler 6 and the thermal expansion coefficient and the magnetic permeability of the composite magnetic sealing material 2. The graph of FIG. 2 represents a case where the magnetic filler 6 is composed of substantially only Fe and Ni. Here, it is assumed that the additive amount of the magnetic filler 6 relative to the composite magnetic sealing material 2 is 70 vol. % and no non-magnetic filler 8 is added to the composite magnetic sealing material 2.

As illustrated in FIG. 2, when the Ni ratio of the magnetic filler 6 is 32 wt. % or more and 39 wt. % or less, the thermal expansion coefficient of the composite magnetic sealing material 2 is remarkably reduced (it may be reduced to 10 ppm/° C. in some conditions). In the example of FIG. 2, the smallest thermal expansion coefficient (about 9.3 ppm/° C.) is obtained when the Ni ratio is about 35 wt. %. On the other hand, the magnetic permeability is not strongly correlated to the Ni ratio, and μ is 12 to 13 in the range of the Ni ratio illustrated in FIG. 2.

The reason that such characteristics are obtained is that invar characteristics where volumetric changes due to thermal expansion and magnetic distortion cancel out each other is exhibited when the Ni ratio falls within the above range. A material where the invar characteristic is exhibited is called an invar material, which is known as a material for a die requiring high precision; however, it was not used as a material for the magnetic filler to be blended in a composite magnetic sealing material. The present inventor pays attention to the magnetic characteristics and small thermal expansion coefficient that the invar material has and uses the invar material as a material for the magnetic filler and thereby realize the composite magnetic sealing material 2 having a small thermal expansion coefficient.

Figure 3:
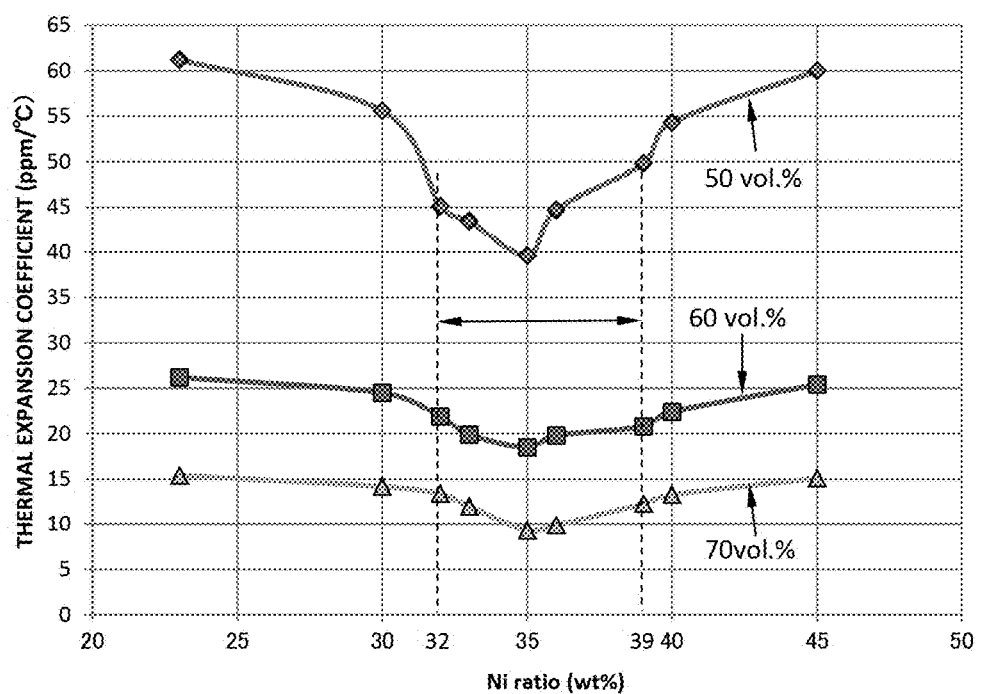
FIG. 3 is a graph illustrating the relationship between the Ni ratio of the magnetic filler and the thermal expansion coefficient of the composite magnetic sealing material.

FIG. 3 is a graph illustrating the relationship between the Ni ratio of the magnetic filler 6 and the thermal expansion coefficient of the composite magnetic sealing material 2. The graph of FIG. 3 represents a case where the magnetic filler 6 is composed substantially of only Fe and Ni. Here, it is assumed that the additive amount of the magnetic filler 6 relative to the composite magnetic sealing material 2 is 50 vol. %, 60 vol. %, or 70 vol. % and no non-magnetic filler 8 is added to the composite magnetic sealing material 2.

As illustrated in FIG. 3, even in a case where the additive amount of the magnetic filler 6 is either 50 vol. %, 60 vol. %, or 70 vol. %, when the Ni ratio of the magnetic filler 6 is 32 wt. % or more and 39 wt. % or less, the thermal expansion coefficient of the composite magnetic sealing material 2 is remarkably reduced. The more the additive amount of the magnetic filler 6 is, the smaller the thermal expansion coefficient. Therefore, when the additive amount of the magnetic filler 6 is small (e.g., 30 vol. %), the non-magnetic filler 8 formed of fused silica is further added to reduce the thermal expansion coefficient of the composite magnetic sealing material 2 to 15 ppm/° C. or less. Specifically, by setting the total additive amount of the magnetic filler 6 and the non-magnetic filler 8 to 50 vol. % or more and 85 vol. % or less, the thermal expansion coefficient of the composite magnetic sealing material 2 can be sufficiently reduced (e.g., to 15 ppm/° C. or less).

Figure 4:
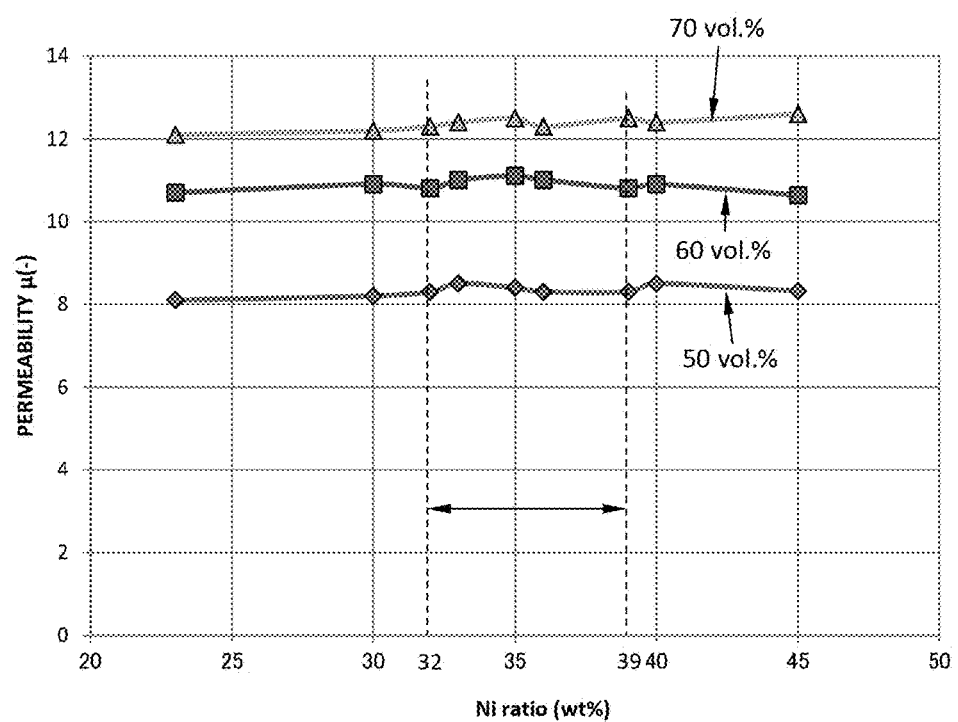
FIG. 4 is a graph illustrating the relationship between the Ni ratio of the magnetic filler and the magnetic permeability of the composite magnetic sealing material.

FIG. 4 is a graph illustrating the relationship between the Ni ratio of the magnetic filler 6 and the magnetic permeability of the composite magnetic sealing material 2. As in the case of the graph of FIG. 3, the graph of FIG. 4 represents a case where the magnetic filler 6 is composed substantially of only Fe and Ni and the additive amount of the magnetic filler 6 relative to the composite magnetic sealing material 2 is 50 vol. %, 60 vol. %, or 70 vol. %, and no non-magnetic filler 8 is added to the composite magnetic sealing material 2.

As illustrated in FIG. 4, even in a case where the additive amount of the magnetic filler 6 is either 50 vol. %, vol. %, or 70 vol. %, the Ni ratio and the magnetic permeability are not strongly correlated to each other. The more the additive amount of the magnetic filler 6 is, the larger the magnetic permeability.

Figure 5:
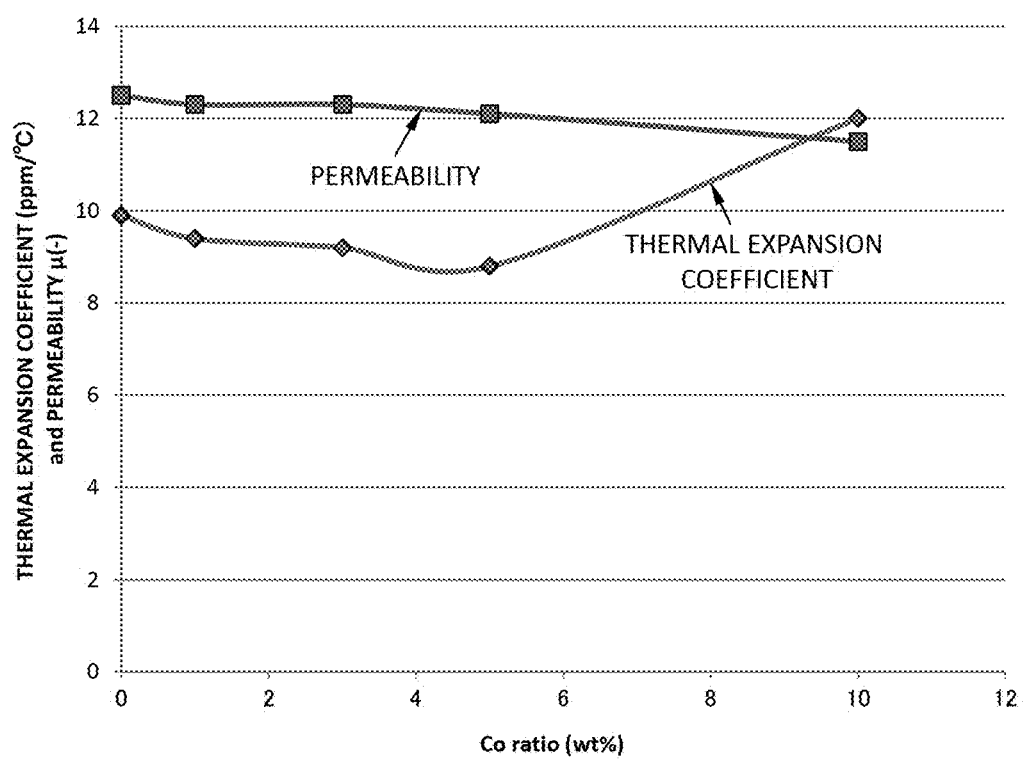
FIG. 5 is a graph illustrating the relationship between the Co ratio of the magnetic filler and the thermal expansion coefficient and magnetic permeability of the composite magnetic sealing material.

FIG. 5 is a graph illustrating the relationship between the Co ratio of the magnetic filler 6 and the thermal expansion coefficient and magnetic permeability of the composite magnetic sealing material 2. The graph of FIG. 5 represents a case where the sum of the amounts of Ni and Co contained in the magnetic filler 6 is 37 wt. %, the additive amount of the magnetic filler 6 relative to the composite magnetic sealing material 2 is 70 vol. %, and no non-magnetic filler 8 is added to the composite magnetic sealing material 2.

As illustrated in FIG. 5, as compared to a case where Co is not contained (Co=0 wt. %) in the magnetic filler 6, the thermal expansion coefficient of the composite magnetic sealing material 2 is further reduced when Ni constituting the magnetic filler 6 is substituted by 8 wt. % or less of Co. However, when the substituted amount by Co is 10 wt. %, the thermal expansion coefficient is conversely increased. Therefore, the additive amount of Co relative to the magnetic filler 6 is preferably 0.1 wt. % or more and 8 wt. % or less.

Figure 6:
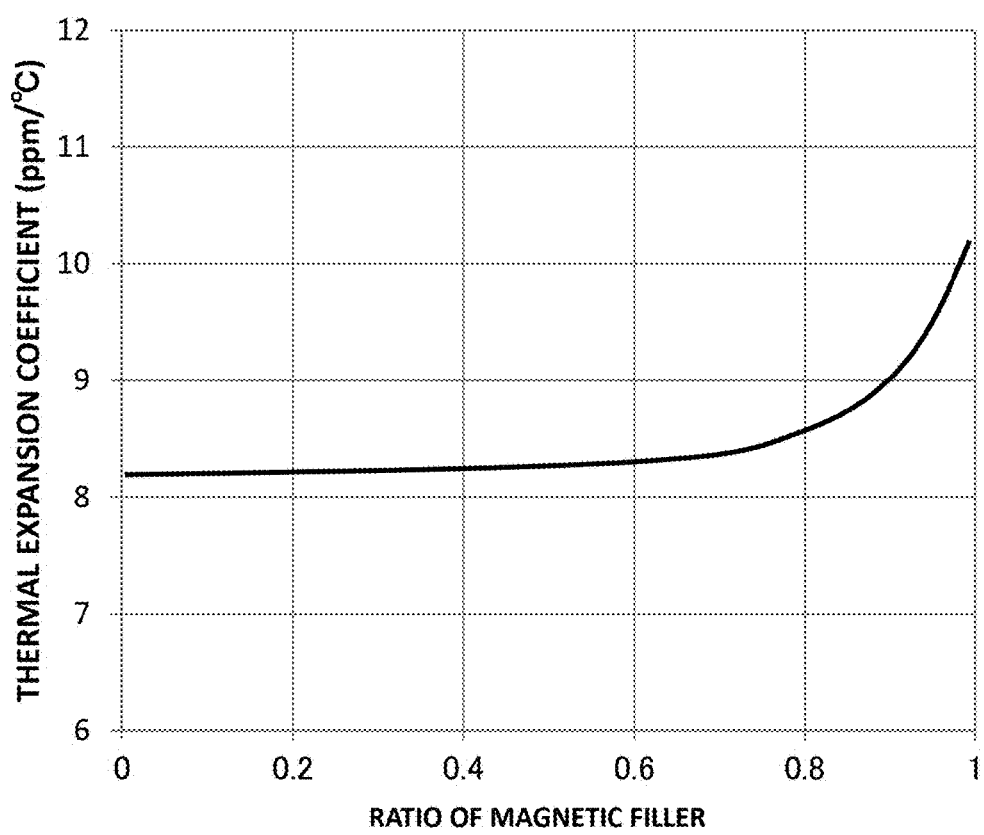
FIG. 6 is a graph illustrating the relationship between the additive ratio of the non-magnetic filler and the thermal expansion coefficient of the composite magnetic sealing material.

FIG. 6 is a graph illustrating the relationship between the additive ratio of the non-magnetic filler 8 and the thermal expansion coefficient of the composite magnetic sealing material 2. The graph of FIG. 6 represents a case where the sum of the amounts of the magnetic filler 6 and the non-magnetic filler 8 is 70 vol. %, the magnetic filler 6 is composed of 64 wt. % of Fe and 36 wt. % of Ni, and the non-magnetic filler 8 is formed of $SiO_2$.

As illustrated in FIG. 6, as the ratio of the amount of the non-magnetic filler 8 is increased, the thermal expansion coefficient of the composite magnetic sealing material 2 is reduced; however, when the amount of the non-magnetic filler 8 exceeds 40 vol. % relative to 60 vol. % of the magnetic filler 6, thermal expansion coefficient reduction effect is nearly saturated. Thus, the amount of the non-magnetic filler 8 relative to the sum of the amounts of the magnetic filler 6 and non-magnetic filler 8 is preferably 1 vol. % or more and 40 vol. % or less.

Figure 7:
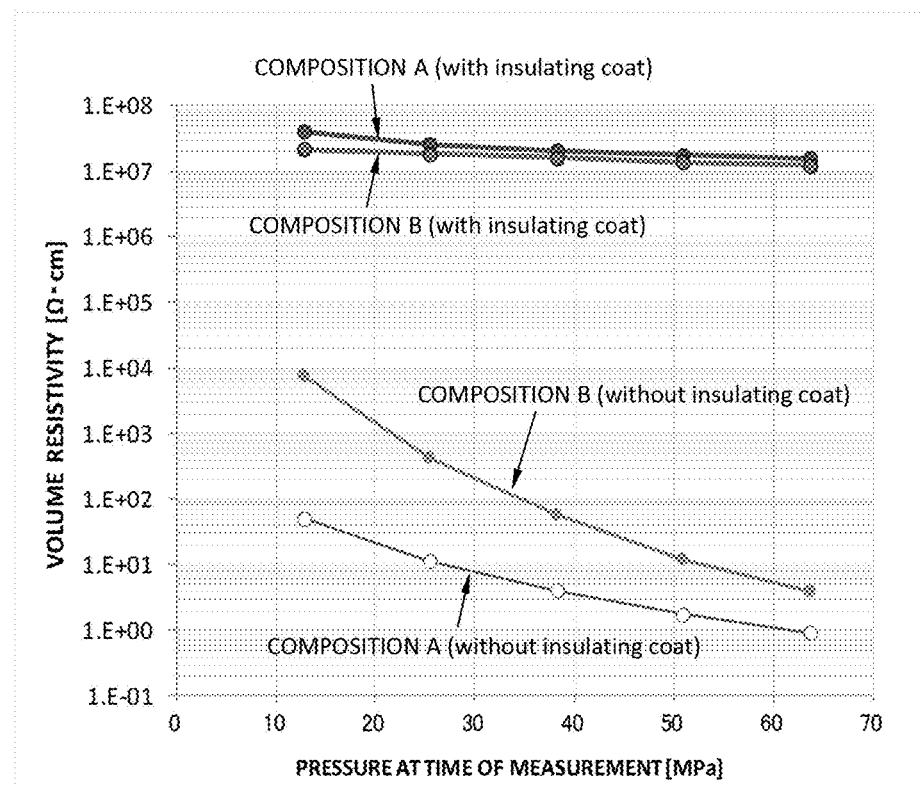
FIG. 7 is a graph illustrating the relationship between the presence/absence of the insulating coat formed on the surface of the magnetic filler and volume resistivity.

FIG. 7 is a graph illustrating the relationship between the presence/absence of the insulating coat 7 formed on the surface of the magnetic filler 6 and volume resistivity. Two compositions are prepared as a material for the magnetic filler 6 as follows: composition A (Fe=64 wt %, Ni=36 wt. %); and composition B (Fe=63 wt. %, Ni=32 wt. %, Co=5 wt. %). The insulating coat 7 is formed of $SiO_2$ having a thickness of 40 nm. The magnetic filler 6 of either the composition A or composition B has a cut diameter of 32 μm and a particle diameter D50 of 20 μm.

As illustrated in FIG. 7, in both the composition A and composition B, coating with the insulating coat 7 significantly increases the volume resistivity of the magnetic filler 6. In addition, the coating with the insulating coat 7 reduces pressure dependency of the magnetic filler 6 at the time of measurement.

Figure 8:
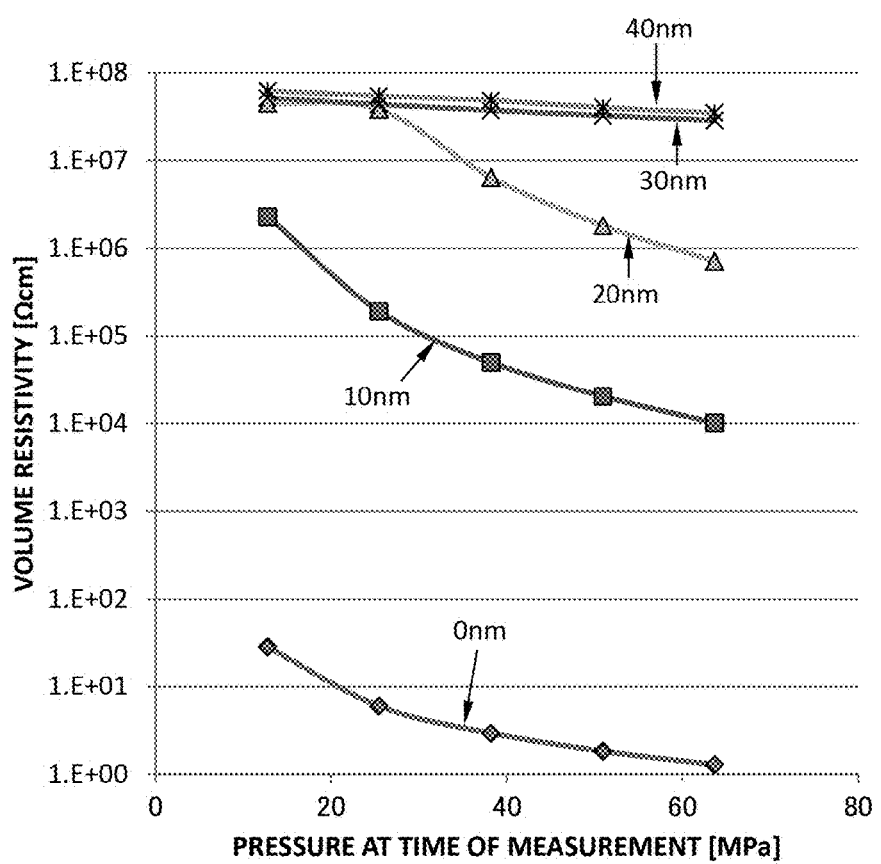
FIG. 8 is a graph illustrating the relationship between the film thickness of the insulating coat formed on the surface of the magnetic filler and volume resistivity.

FIG. 8 is a graph illustrating the relationship between the film thickness of the insulating coat 7 formed on the surface of the magnetic filler 6 and volume resistivity. The graph of FIG. 8 represents a case where the magnetic filler 6 is composed of 64 wt. % of Fe and 36 wt. % of Ni. The particle diameter of the magnetic filler 6 is equal to the particle diameter of the magnetic filler 6 in the example of FIG. 7.

As illustrated in FIG. 8, by coating the magnetic filler 6 with the insulating coat 7 having a film thickness of 10 nm or more, the volume resistivity of the magnetic filler 6 is increased. In particular, when the magnetic filler 6 is coated with the insulating coat 7 having a film thickness of 30 nm or more, a very high volume resistivity can be obtained regardless of an applied pressure at the time of measurement.

Figure 9:
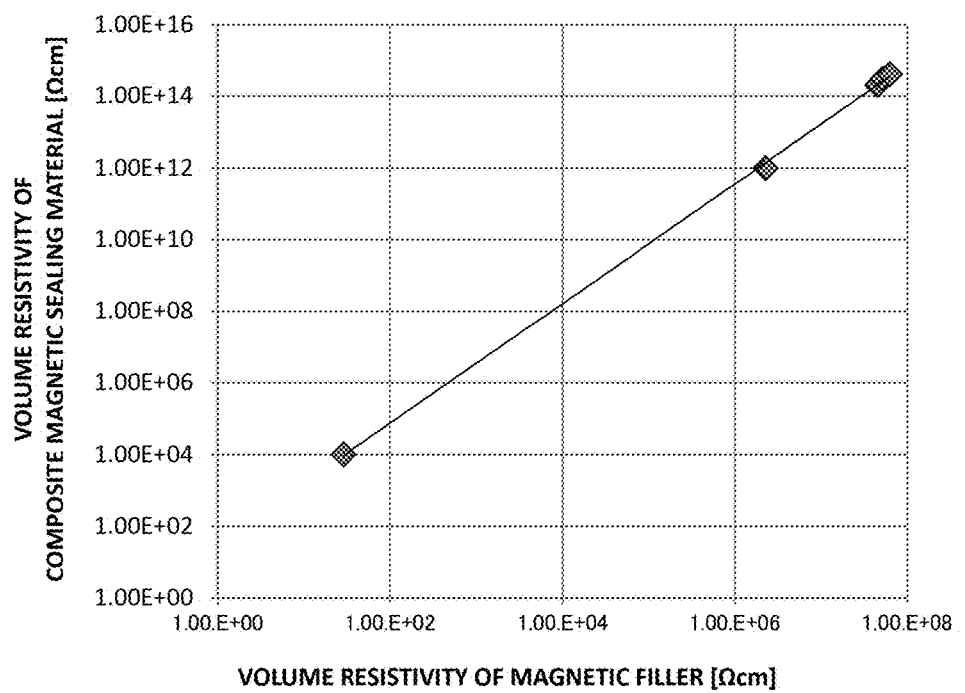
FIG. 9 is a graph illustrating the relationship between the volume resistivity of the magnetic filler 6 and that of the composite magnetic sealing material 2.

FIG. 9 is a graph illustrating the relationship between the volume resistivity of the magnetic filler 6 and that of the composite magnetic sealing material 2.

As illustrated in FIG. 9, the volume resistivity of the magnetic filler 6 and that of the composite magnetic sealing material 2 are in proportion to each other. In particular, when the volume resistivity of the magnetic filler 6 is $10^5$ Ωcm or more, the volume resistivity of the composite magnetic sealing material 2 can be increased to $10^{10}$ Ωcm or more. When the composite magnetic sealing material 2 having a volume resistivity of $10^{10}$ Ωcm or more is used as a molding material for electronic circuit package, a sufficient insulating performance can be ensured.

Figure 10A:
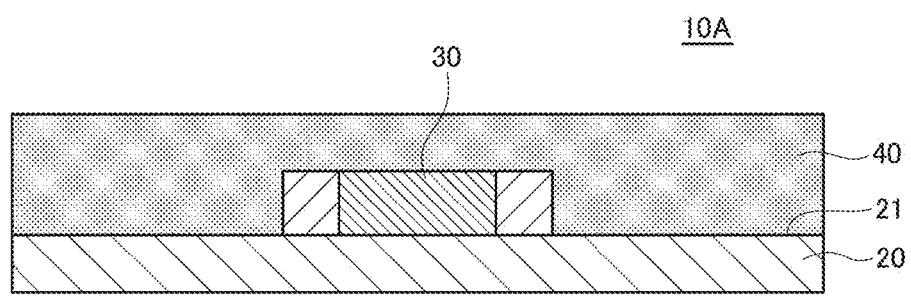
FIGS. 10A and 10B are schematic cross-sectional views illustrating a structure of an electronic circuit package using the composite magnetic sealing material.
Figure 10B:
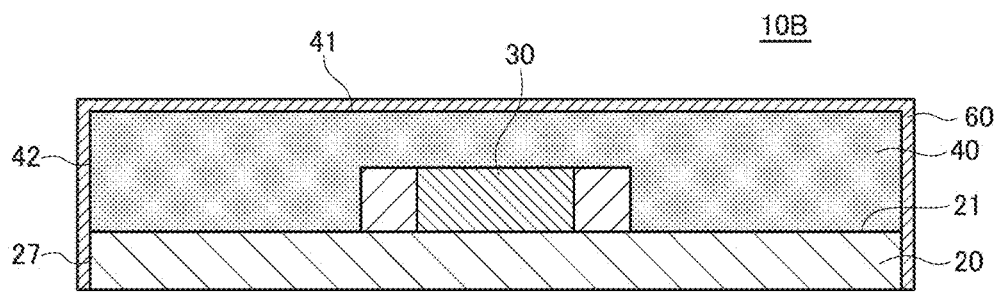

FIG. 10A is a schematic cross-sectional view illustrating a structure of an electronic circuit package 10A using the composite magnetic sealing material 2. FIG. 10B is a schematic cross-sectional view illustrating a structure of an electronic circuit package 10B using the composite magnetic sealing material 2.

The electronic circuit package 10A illustrated in FIG. 10A includes a substrate 20, an electronic component 30 mounted on the substrate 20, and a magnetic mold resin 40 that covers a surface 21 of the substrate 20 so as to embed the electronic component 30 therein. The magnetic mold resin 40 is formed of the composite magnetic sealing material 2. The electronic circuit package 10B differs from the electronic circuit package 10A in that it further includes a metal film 60 that covers an upper surface 41 and a side surface 42 of the magnetic mold resin 40 and covers a side surface 27 of the substrate 20. In both the electronic circuit packages 10A and 10B, the substrate 20 has a thickness of 0.25 mm, and the magnetic mold resin 40 has a thickness of 0.50 mm.

Figure 11:
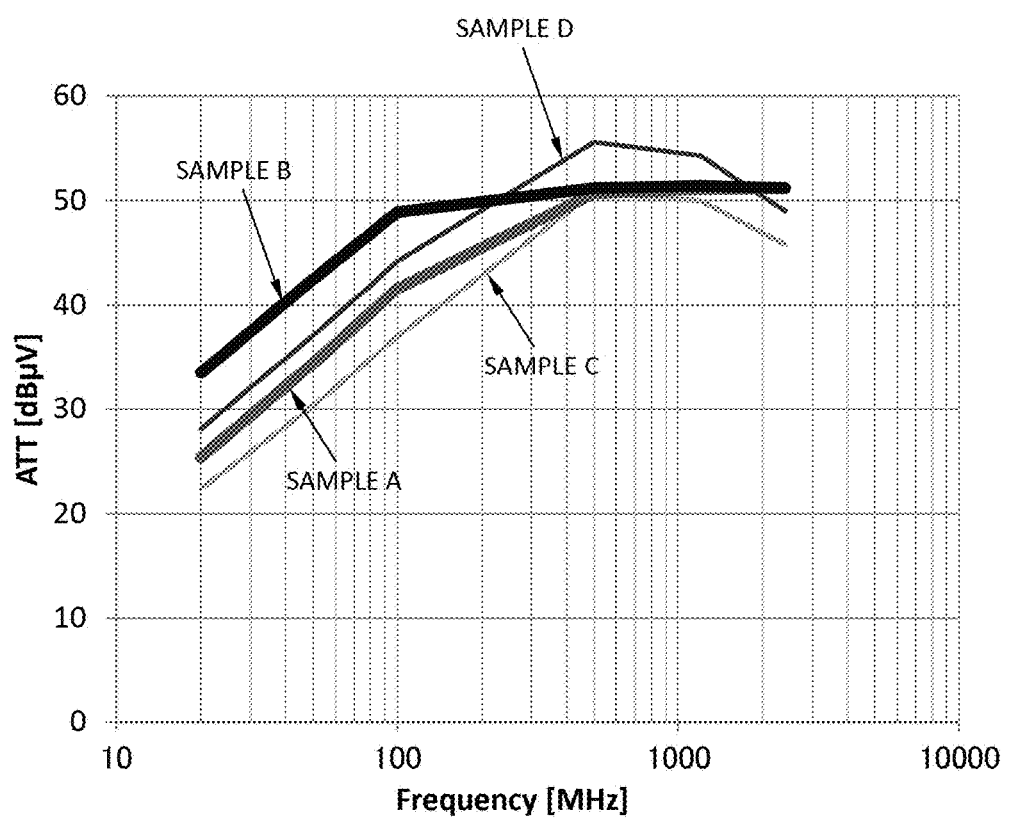
FIG. 11 is a graph illustrating noise attenuation in the electronic circuit package shown in FIG. 10B.

FIG. 11 is a graph illustrating noise attenuation in the electronic circuit package 10B. The metal film 60 is composed of a laminated film of Cu and Ni, and two types of metal films 60 whose Cu films have different thicknesses are evaluated. Specifically, the metal film 60 of sample A has a configuration in which the Cu film having a thickness of 4 μm and the Ni film having a thickness of 2 μm are laminated, and the metal film 60 of sample B has a configuration in which the Cu film having a thickness of 7 μm and the Ni film having a thickness of 2 μm are laminated. For comparison, values of samples C and D each formed by using a molding material not containing the magnetic filler 6 are also shown. The metal film 60 of sample C has a configuration in which the Cu film having a thickness of 4 μm and the Ni film having a thickness of 2 μm are laminated, and the metal film 60 of sample D has a configuration in which the Cu film having a thickness of 7 μm and the Ni film having a thickness of 2 μm are laminated.

As illustrated in FIG. 11, when the composite magnetic sealing material 2 containing the magnetic filler 6 is used, noise attenuation effect is enhanced especially at a frequency band of 100 MHz or less as compared to a case where the molding material not containing the magnetic filler 6 is used. Further, it can be seen that the larger the thickness of the metal film 60, the higher the noise attenuation performance.

Figure 12:
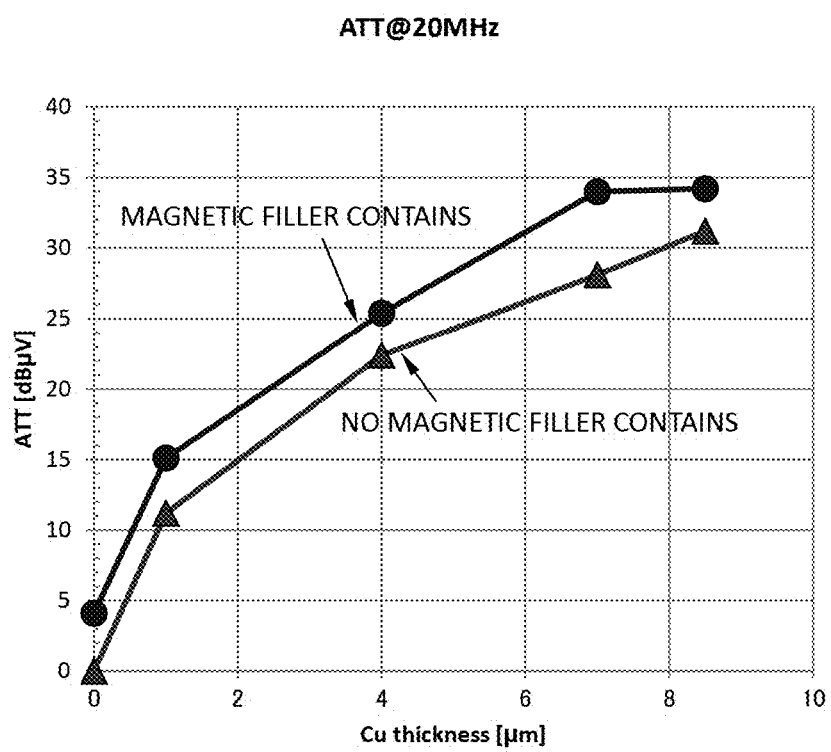
FIGS. 12 to 14 are graphs each illustrating the relationship between the film thickness of the metal film included in the electronic circuit package shown in FIG. 10B and noise attenuation.
Figure 13:
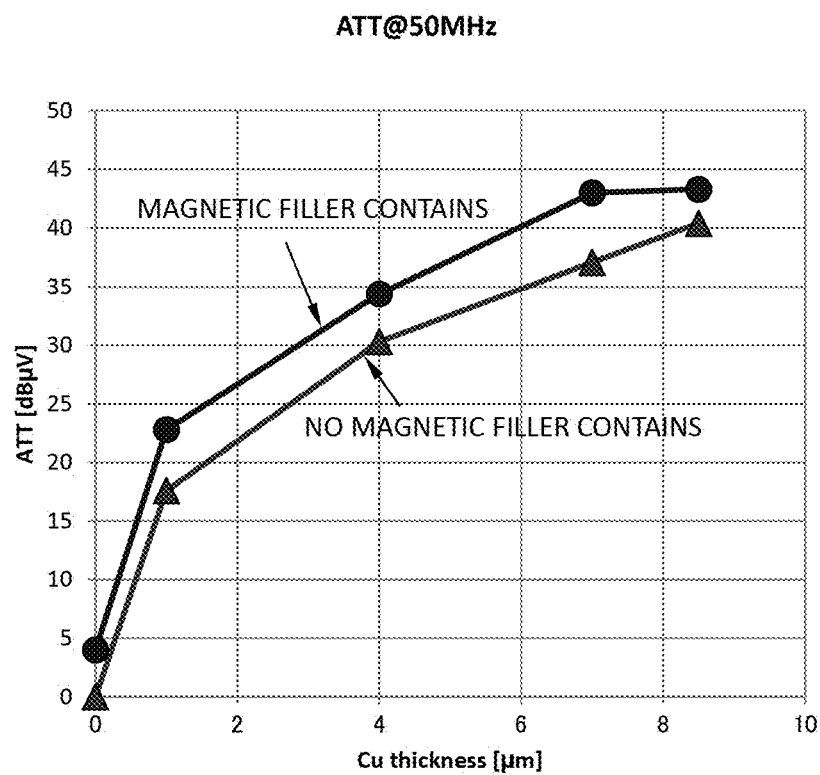
Figure 14:
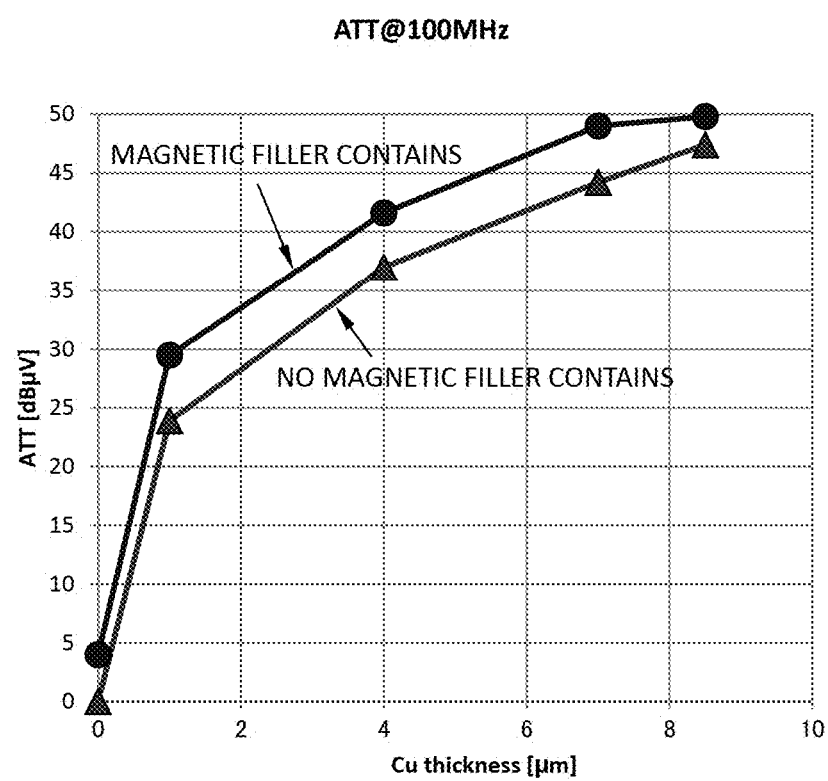

FIGS. 12 to 14 are graphs each illustrating the relationship between the film thickness of the metal film 60 included in the electronic circuit package 10B and noise attenuation. FIG. 12, FIG. 13, and FIG. 14 illustrate the noise attenuation in the frequency bands of 20 MHz, 50 MHz, and 100 MHz, respectively. For comparison, a value obtained when a molding material not containing the magnetic filler 6 is also shown.

As illustrated, in all the frequency bands of FIGS. 12 to 14, the larger the thickness of the metal film 60, the higher the noise attenuation performance. Further, by using the composite magnetic sealing material 2 containing the magnetic filler 6, it is possible to obtain higher noise attenuation performance in all the frequency bands of FIGS. 12 to 14, than in a case where a molding material not containing the magnetic filler 6.

Figure 15:
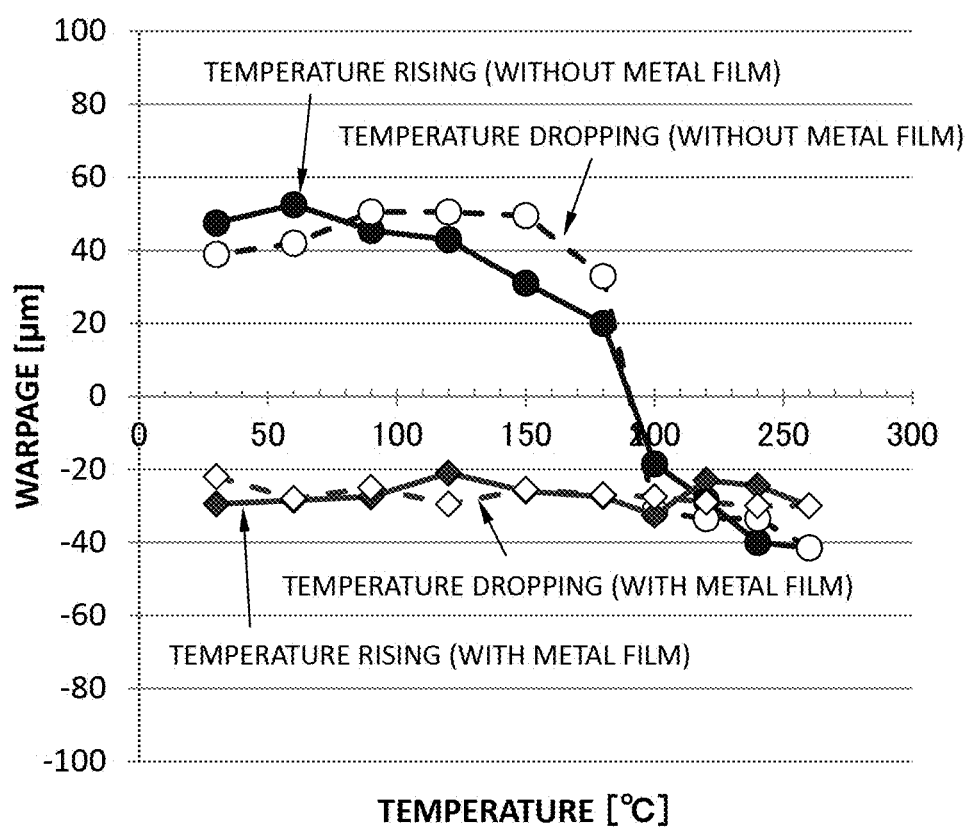
FIGS. 15 and 16 are graphs illustrating the warp amount of the substrate during temperature rising and that during temperature dropping in the electronic circuit packages shown in FIGS. 10A and 10B.
Figure 16:
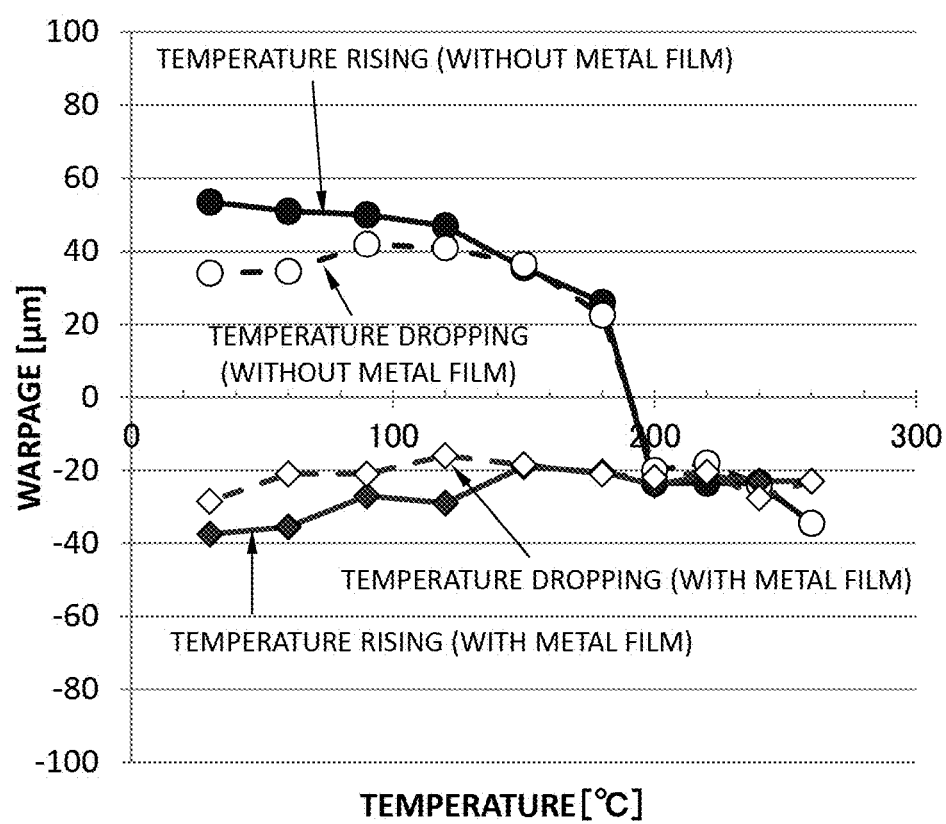

FIG. 15 is a graph illustrating the warp amount of the substrate 20 during temperature rising and that during temperature dropping in the electronic circuit packages 10A and 10B. For comparison, values obtained when the magnetic filler 6 is substituted by the non-magnetic filler formed of $SiO_2$ are shown in FIG. 16.

As illustrated in FIG. 15, the warp amount of the substrate 20 caused due to a temperature change is smaller in the electronic circuit package 10B having the metal film 60 than in the electronic circuit package 10A not having the metal film 60. Further, as is clear from a comparison between FIGS. 15 and 16, the warp characteristics of the respective electronic circuit packages 10A and 10B using the composite magnetic sealing material 2 containing the magnetic filler 6 are substantially equivalent to the warp characteristics of the respective electronic circuit packages 10A and 10B using a molding material containing the non-magnetic filler formed of $SiO_2$.

While the preferred embodiments of the present invention have been described, the present invention is not limited thereto. Thus, various modifications may be made without departing from the gist of the invention, and all of the modifications thereof are included in the scope of the present invention.

EXAMPLES

<Production of Composite Magnetic Sealing Material>

A resin material was prepared with 830S (bisphenol A epoxy resin) made by Dainippon Ink & Chemicals, Inc., used as a base resin, with 0.5 equivalent of dicyandiamide made by Nippon Carbide Industries Co., Inc. added to the base resin as a curing agent, and with 1 wt. % of C11Z-CN (imidazole) made by Shikoku Chemicals Corporation added to the base resin as a curing accelerator.

50 vol. %, 60 vol. %, or 70 vol. % of a magnetic filler having the composition illustrated in FIG. 17 was added to the above resin material, followed by intensive kneading to obtain a paste. If pasting failed, butylcarbitol acetate was added appropriately. The obtained paste was coated to a thickness of about 300 μm and then heat-cured sequentially at 100° C. for one hour, at 130° C. for one hour, at 150° C. for one hour, and at 180° C. for one hour in this order, to obtain a cured sheet. The composition 1 (comparative example) is a magnetic material generally called PB Permalloy.

<Measurement of Thermal Expansion Coefficient>

The above cured sheet was cut to a length of 12 mm and a width of 5 mm. Then, TMA was used to raise temperature from room temperature to 200° C. at 5° C./min, and a thermal expansion coefficient was calculated from the amount of expansion in a temperature range of 50° C. to 100° C. which is lower than a glass transition temperature. The measurement results are shown in FIG. 18. In FIG. 18, the measurement result obtained when the non-magnetic filler formed of $SiO_2$ is used in place of the magnetic filler is also shown.

As illustrated in FIG. 18, when the magnetic filler having the composition 2 or 3 is used, the thermal expansion coefficient is significantly reduced as compared to when the magnetic filler having the composition 1 (comparative example) is used. In particular, when the additive amount is 60 vol. % or more, a thermal expansion coefficient equivalent to that obtained when the non-magnetic filler formed of SiO$_2$ is used is obtained, and when the additive amount is 70 vol. %, the thermal expansion coefficient is as small as 10 ppm/° C. or less.

<Measurement of Magnetic Permeability>

The above cured sheet was cut into a ring shape having an outer diameter of 7.9 mm and an inner diameter of 3.1 mm. Then, the material analyzer function of impedance analyzer E4991 manufactured by Agilent Corp., Ltd. was used to measure an effective magnetic permeability (μ') at 10 MHz. The measurement results are shown in FIG. 19.

As illustrated in FIG. 19, the magnetic permeability obtained when the magnetic filler having the composition 2 or 3 is substantially equivalent to the magnetic permeability obtained when the magnetic filler having the composition 1 (Comparative Example) is used.

<Considerations>

The composite magnetic sealing material obtained by adding the magnetic filler having the composition 2 or 3 to a resin material has a thermal expansion coefficient equivalent to the thermal expansion coefficient obtained when the non-magnetic filler formed of SiO$_2$ is used and has a magnetic permeability equivalent to the magnetic permeability obtained when the magnetic filler formed of PB permalloy is used. Thus, by using, as a sealing material for an electronic circuit package, the composite magnetic sealing material obtained by adding the magnetic filler having the composition 2 or 3 to a resin material, it is possible to obtain excellent magnetic shielding characteristics while preventing the warp of the substrate, interfacial delamination or crack of a molding material.

What is claimed is:

1. A composite magnetic sealing material comprising:
a resin material; and
a filler blended in the resin material in a blended ratio of 30 vol. % or more to 85 vol. % or less,
wherein the filler includes a magnetic filler containing Fe and 32 wt. % or more and 39 wt. % or less of a metal material composed mainly of Ni, thereby a thermal expansion coefficient of the composite magnetic sealing material is 15 ppm/° C. or less.

2. The composite magnetic sealing material as claimed in claim 1, wherein the metal material further contains 0.1 wt. % or more and 8 wt. % or less of Co relative to a total weight of the magnetic filler.

3. The composite magnetic sealing material as claimed in claim 1, wherein the filler further includes a non-magnetic filler.

4. The composite magnetic sealing material as claimed in claim 3, wherein a ratio of an amount of the non-magnetic filler relative to a sum of an amounts of the magnetic filler and the non-magnetic filler is 1 vol. % or more and 40 vol. % or less.

5. The composite magnetic sealing material as claimed in claim 4, wherein the non-magnetic filler contains at least one material selected from a group consisting of SiO$_2$, ZrW$_2$O$_8$, (ZrO)$_2$P$_2$O$_7$, KZr$_2$(PO$_4$)$_3$, or Zr$_2$(WO$_4$)(PO$_4$)$_2$.

6. The composite magnetic sealing material as claimed in claim 1, wherein the magnetic filler has a substantially spherical shape.

7. The composite magnetic sealing material as claimed in claim 1, wherein the magnetic filler is coated with an insulating material.

8. The composite magnetic sealing material as claimed in claim 7, wherein a film thickness of the insulating material is 10 nm or more.

9. The composite magnetic sealing material as claimed in claim 1, wherein the resin material comprises a thermosetting resin material.

10. The composite magnetic sealing material as claimed in claim 9, wherein the thermosetting resin material contains at least one material selected from a group consisting of an epoxy resin, a phenol resin, a urethane resin, a silicone resin, or an imide resin.

11. The composite magnetic sealing material as claimed in claim 1, wherein a volume resistivity of the composite magnetic sealing material is $10^{10}$ Ωcm or more.

12. A composite magnetic sealing material comprising:
a resin material;
a magnetic filler formed of an Fe—Ni based material blended in the resin material, the magnetic filler containing Fe and 32 wt. % or more and 39 wt. % or less of a metal material composed mainly of Ni; and
a non-magnetic filler blended in the resin material,
wherein a ratio of an amount of the non-magnetic filler relative to a sum of an amounts of the magnetic filler and the non-magnetic filler is 1 vol. % or more and 40 vol. % or less, and
wherein a thermal expansion coefficient of the composite magnetic sealing material is 15 ppm/° C. or less.

13. The composite magnetic sealing material as claimed in claim 12, wherein the magnetic filler is coated with an insulating material having a film thickness is 10 nm or more.

14. The composite magnetic sealing material as claimed in claim 12, wherein the non-magnetic filler contains at least one material selected from a group consisting of SiO$_2$, ZrW$_2$O$_8$, (ZrO)$_2$P$_2$O$_7$, KZr$_2$(PO$_4$)$_3$, or Zr$_2$(WO$_4$)(PO$_4$)$_2$.

* * * * *